(12) United States Patent
Tamura

(10) Patent No.: US 8,878,520 B2
(45) Date of Patent: Nov. 4, 2014

(54) CURRENT SENSOR

(71) Applicant: Alps Green Devices Co., Ltd., Tokyo (JP)

(72) Inventor: Manabu Tamura, Miyagi-ken (JP)

(73) Assignee: Alps Green Devices Co., Ltd., Tokyo (JP)

( * ) Notice: Subject to any disclaimer, the term of this patent is extended or adjusted under 35 U.S.C. 154(b) by 0 days.

(21) Appl. No.: 14/077,020

(22) Filed: Nov. 11, 2013

(65) Prior Publication Data

US 2014/0070801 A1  Mar. 13, 2014

Related U.S. Application Data

(63) Continuation of application No. PCT/JP2013/060227, filed on Apr. 3, 2013.

(30) Foreign Application Priority Data

May 16, 2012  (JP) .................. 2012-112340

(51) Int. Cl.
  *G01R 15/20*  (2006.01)
  *G01R 33/02*  (2006.01)
  *G01R 19/00*  (2006.01)
(52) U.S. Cl.
  CPC ............ *G01R 19/00* (2013.01); *G01R 33/02* (2013.01); *G01R 15/20* (2013.01)
  USPC ..................................... 324/117 R; 324/244

(58) Field of Classification Search
  USPC .................................. 324/117 H, 244, 117 R
  See application file for complete search history.

(56) References Cited

U.S. PATENT DOCUMENTS

| 8,212,549 | B2 * | 7/2012 | McNulty et al. .............. 324/141 |
| 2006/0043960 | A1 | 3/2006 | Itoh et al. |
| 2007/0096716 | A1 | 5/2007 | Shoji |

FOREIGN PATENT DOCUMENTS

| JP | 2001-66327 | 3/2001 |
| JP | 2006-71457 | 3/2006 |
| JP | 2010-19747 | 1/2010 |
| JP | 2010-266290 | 11/2010 |

* cited by examiner

*Primary Examiner* — Bot Ledynh
(74) *Attorney, Agent, or Firm* — Beyer Law Group LLP

(57) ABSTRACT

A current sensor includes a first conductor and a second conductor arranged so as to form current paths parallel to each other; a circuit board arranged such that a surface thereof is perpendicular to the current paths; and a first magnetoelectric transducer and a second magnetoelectric transducer arranged on the surface of the circuit board such that the first conductor is interposed therebetween. The first conductor, the second conductor, the first magnetoelectric transducer, and the second magnetoelectric transducer are located on a same plane.

4 Claims, 7 Drawing Sheets

CURRENT SENSOR

CLAIM OF PRIORITY

This application is a Continuation of International Application No. PCT/JP2013/060227 filed on Apr. 3, 2013, which claims benefit of Japanese Patent Application No. 2012-112340 filed on May 16, 2012. The entire contents of each application noted above are hereby incorporated by reference.

BACKGROUND OF THE INVENTION

1. Field of the Invention

The present invention relates to a current sensor capable of measuring, in a non-contact manner, a current flowing through a conductor, and particularly relates to a current sensor that detects a magnetic field generated by a current and measures a current value.

2. Description of the Related Art

A current sensor capable of measuring a current value in a non-contact manner on the basis of an induction field generated by a measured current, has been put to practical use. The current sensor includes a magnetoelectric transducer for detecting an induction field, and calculates a current value of a measured current on the basis of the intensity of a magnetic field detected by the magnetoelectric transducer. For example, a Hall element which converts the intensity of a magnetic field into an electrical signal using a Hall effect, a magnetoresistance effect element which uses a change in an electrical resistance value by a magnetic field, or the like is used as the magnetoelectric transducer.

A non-contact type current sensor may be used, for example, for measuring a current flowing through an inverter for motor driving. Currents of a plurality of phases flow through the inverter. Thus, to achieve high current measurement accuracy in this use, it is necessary to appropriately eliminate influence of an induction field generated by a current of another phase. For such a purpose, a current sensor has been proposed which has a configuration in which a plurality of conductors forming current paths are arranged within a single plane and a magnetic sensor is arranged symmetrically to the plane (e.g., see U.S. Patent Application Publication No. 2007/0096716).

In the above-described current sensor, the magnetic sensor is arranged such that the magnetic sensor is unlikely to be influenced by an induction field generated by a current of another phase, and thus current measurement accuracy is maintained to some extent. However, to achieve sufficiently high current measurement accuracy, it is necessary to arrange the magnetic sensor such that the magnetic sensor is tilted relative to the current paths, but this arrangement is not realistic in terms of mounting accuracy and manufacturing cost.

The present invention has been made in view of such a point and provides a current sensor having a simple structure which is able to eliminate influence of an induction field generated by a current flowing through an adjacent conductor.

SUMMARY OF THE INVENTION

According to the present invention, a current sensor includes: a first conductor and a second conductor arranged so as to form current paths parallel to each other; a circuit board arranged such that a surface thereof is perpendicular to the current paths; and a first magnetoelectric transducer and a second magnetoelectric transducer arranged on the surface of the circuit board such that the first conductor is interposed therebetween. The first conductor, the second conductor, the first magnetoelectric transducer, and the second magnetoelectric transducer are located on a same plane orthogonal to the surface of the circuit board.

According to this configuration, it is possible to cause outputs (output change) of the first magnetoelectric transducer and the second magnetoelectric transducer to have the same polarity, by a simple configuration in which the first conductor, the second conductor, the first magnetoelectric transducer, and the second magnetoelectric transducer are located on the same plane. Thus, it is possible to eliminate influence of an induction field generated by a current flowing through the second conductor, by a differential operation. In other words, it is possible to realize a current sensor with a simple structure which is able to eliminate influence of an induction field generated by a current flowing through the adjacent second conductor.

In the current sensor according to the present invention, preferably, each of the first conductor and the second conductor has a flat plate shape in which a width direction thereof is orthogonal to the plane, and a center position thereof in the width direction is located on the plane. According to this configuration, a change in the direction of an induction field generated by a current flowing through the second conductor is made small around the center position of the first conductor. Thus, even when the positions of the first magnetoelectric transducer and the second magnetoelectric transducer displaced slightly, the directions in which an induction field is applied to the first magnetoelectric transducer and the second magnetoelectric transducer are allowed to be substantially the same. Thus, it is possible to more appropriately eliminate influence of the induction field generated by the current flowing through the second conductor.

The current sensor according to the present invention preferably further includes a pair of magnetic shields arranged such that the first conductor, the first magnetoelectric transducer, and the second magnetoelectric transducer are interposed therebetween, the magnetic shields intersecting the plane. According to this configuration, it is possible to further reduce influence of an induction field generated by a current flowing through the second conductor, by a pair of the magnetic shields. Thus, it is possible to achieve higher current measurement accuracy.

In the current sensor according to the present invention, each of the first magnetoelectric transducer and the second magnetoelectric transducer is preferably arranged such that a sensitivity axis direction thereof is orthogonal to the plane.

In the current sensor according to the present invention, preferably, each of the first conductor and the second conductor includes a thin plate portion and thick plate portions at both sides of the thin plate portion, and the first magnetoelectric transducer and the second magnetoelectric transducer are arranged such that the thin plate portion of the first conductor is interposed therebetween. According to this configuration, the electrical resistance of the first conductor is reduced by the thick plate portion, and thus it is possible to suppress heat generation by flowing of a measured current. As a result, it is possible to achieve higher current measurement accuracy.

DESCRIPTION OF THE PREFERRED EMBODIMENTS

Figure 3A:
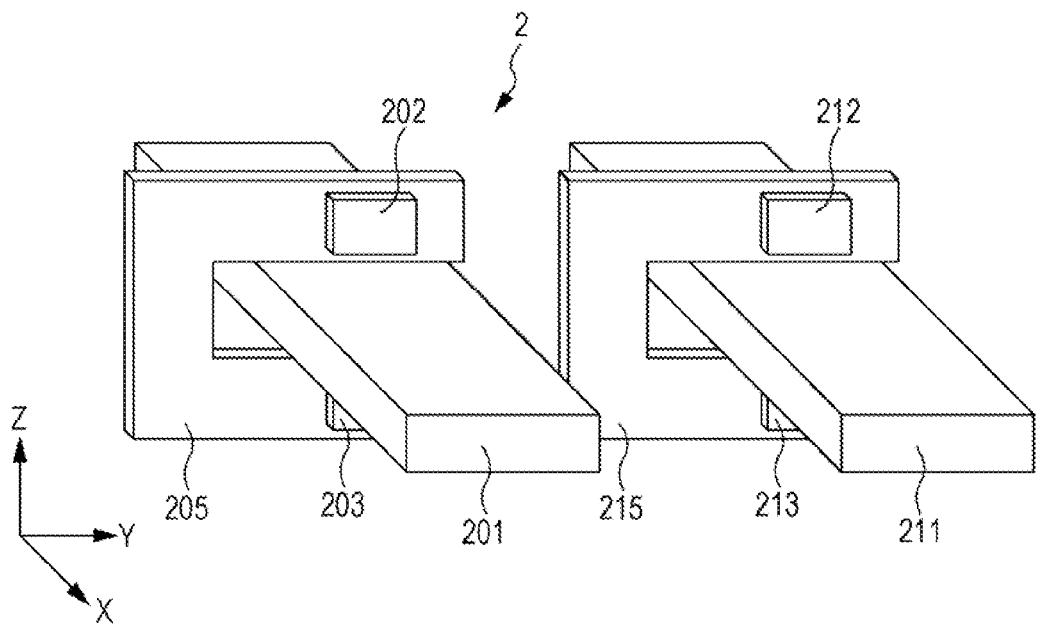
FIGS. 3A and 3B are schematic diagrams showing a configuration example of a current sensor as a comparative example.
Figure 3B:
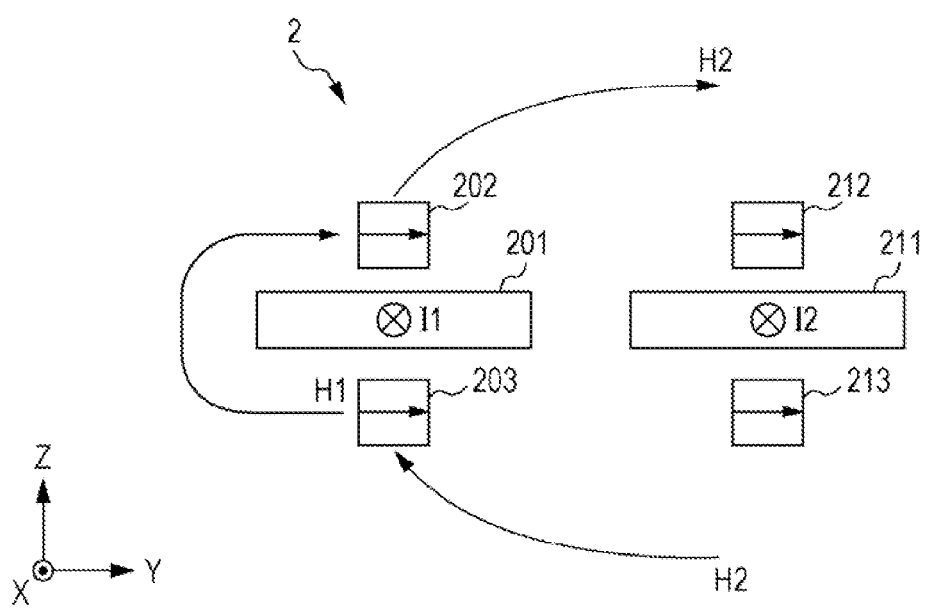

A configuration example of a typical current sensor will be described with reference to FIGS. 3A and 3B. FIGS. 3A and 3B are schematic diagrams showing a configuration example of a current sensor 2 in which a plurality of conductors forming current paths are arranged adjacently. FIG. 3A is a perspective view schematically showing a configuration of the current sensor 2, and FIG. 3B is a schematic diagram showing a positional relationship between conductors 201 and 211 and magnetoelectric transducers 202, 203, 212, and 213 in the current sensor 2.

As shown in FIG. 3A, the current sensor 2 includes the conductors 201 and 211 forming current paths; and the magnetoelectric transducers 202 and 203 arranged such that the conductor 201 is interposed therebetween. The magnetoelectric transducers 202 and 203 are mounted on a substantially U-shaped circuit board 205 arranged around the conductor 201. An arithmetic circuit (not shown) is provided on the circuit board 205 and connected to the magnetoelectric transducers 202 and 203, and outputs of the magnetoelectric transducers 202 and 203 are subjected to a differential operation by the arithmetic circuit. It should be noted that the magnetoelectric transducers 212 and 213, a circuit board 215, and an arithmetic circuit (not shown) which have the same configurations are also arranged at the conductor 211 side.

As shown in FIG. 3B, the current sensor 2 detects, with the magnetoelectric transducers 202 and 203, an induction field H1 generated by a measured current I1 flowing through the conductor 201, and outputs an electrical signal (e.g., a voltage) corresponding to the measured current I1. The magnetoelectric transducers 202 and 203 are arranged such that sensitivity axes thereof are directed in the same direction, and generate a pair of outputs having reverse polarity when the induction field H1 is applied thereto. The outputs of the magnetoelectric transducers 202 and 203 are subjected to a differential operation by the arithmetic circuit connected to the magnetoelectric transducers 202 and 203, and a result of the operation is outputted to a subsequent stage as an output of the current sensor 2.

In the current sensor 2, when a current I2 flows through the conductor 211, an induction field H2 is generated by the current I2 at a position where the magnetoelectric transducers 202 and 203 are arranged. The magnetoelectric transducers 202 and 203 to which the induction field H2 is applied generate a pair of outputs having reverse polarity (an output change) in accordance with a component of the induction field H2 in the sensitivity axis direction. Here, for example, when the outputs are voltages, the polarity of the outputs means positive/negative of the output voltages, and a pair of outputs having reverse polarity (an output change) refers to a pair of output voltages having a relationship in which positive and negative are inverted.

Such outputs of the magnetoelectric transducers 202 and 203 which have reverse polarity cannot be cancelled by the differential operation of the arithmetic circuit, and thus the sensor output of the current sensor 2 is changed by influence of the induction field H2. In other words, in the current sensor 2, the current measurement accuracy is decreased by influence of the current I2 flowing through the adjacent conductor 211.

The reason why the current measurement accuracy of the current sensor 2 is decreased is that outputs having reverse polarity (an output change) that cannot be cancelled by a differential operation occur in the magnetoelectric transducers 202 and 203. In other words, it is thought that this problem is eliminated when it is possible to make the outputs (output change) of the magnetoelectric transducers 202 and 203, by influence of the induction field H2, to have the same polarity.

The present inventor has focused on this point and has thought that when the arrangement of each component in a current sensor is modified, it may be possible to make outputs (output change) of a pair of magnetoelectric transducers to have the same polarity with a simple configuration. Then, the present inventor has found that when a pair of magnetoelectric transducers are arranged at positions where an induction field generated by a current flowing through an adjacent current path is directed in the same direction, it is possible to make outputs (output change) of the pair of magnetoelectric transducers to have the same polarity, and has completed the present invention.

Specifically, an essential feature of the present invention is that a second conductor adjacent to a first conductor forming a current path of a measured current and a first magnetoelectric transducer and a second magnetoelectric transducer arranged such that the first conductor is interposed therebetween are arranged along the same plane. With this simple configuration, it is possible to make the direction of an induction field generated by a current flowing through the second conductor to be substantially the same in the first magnetoelectric transducer and the second magnetoelectric transducer, and it is possible to make outputs (output change) of the first magnetoelectric transducer and the second magnetoelectric transducer to have the same polarity. As a result, it is made possible to eliminate influence of an induction field generated by a current flowing through the second conductor, by a differential operation.

Here, "the same plane" means a virtual plane indicating positions where the second conductor, the first magnetoelectric transducer, and the second magnetoelectric transducer are arranged, and "arranged along the same plane" means to be arranged near the virtual plane to such a degree that it is possible to reduce influence of an induction field generated by a current flowing through the second conductor forming an adjacent current path. For example, even when the direction of an induction field generated by a current flowing through the second conductor is different between the position where the first magnetoelectric transducer is arranged and the position where the second magnetoelectric transducer is arranged, if the difference therebetween is small (e.g., within 10°), it is possible to reduce influence of an induction field generated by a current flowing through the second conductor, to such a degree as to cause no practical problem (about 1%). Thus, an arrangement in which the direction of the induction field generated by the current flowing through the second conductor is different within 10° is also included in "arranged along the same plane". Hereinafter, embodiments of the present invention will be described in detail with reference to the accompanying drawings.

(Embodiment 1)

Figure 1A:
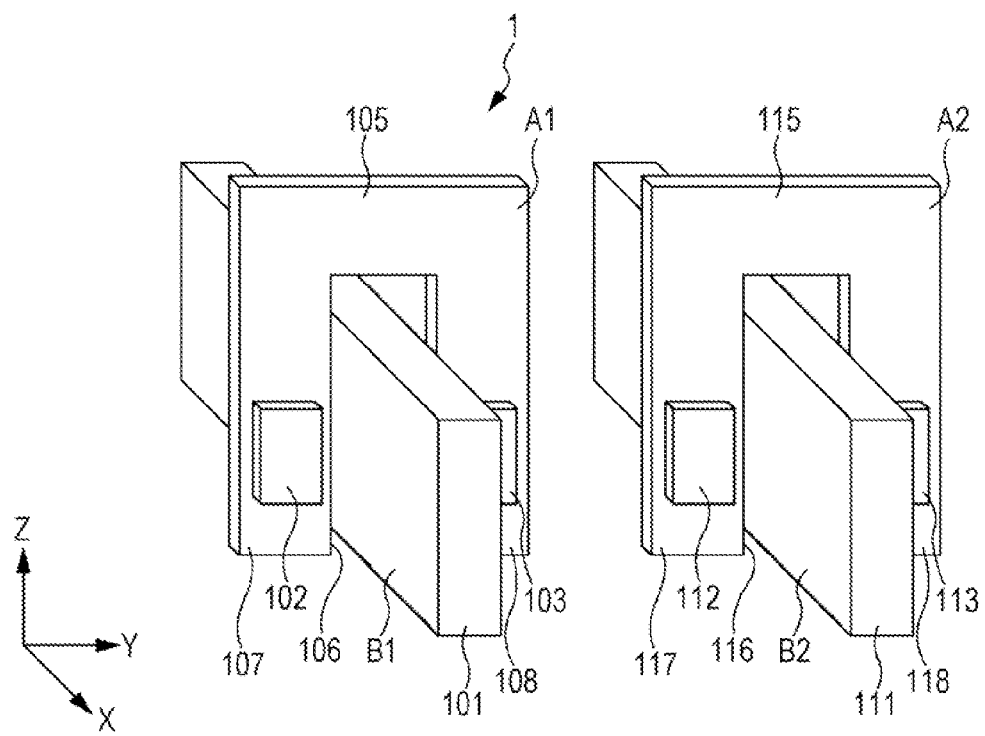
FIGS. 1A and 1B are schematic diagrams showing a configuration example of a current sensor according to Embodiment 1.
Figure 1B:
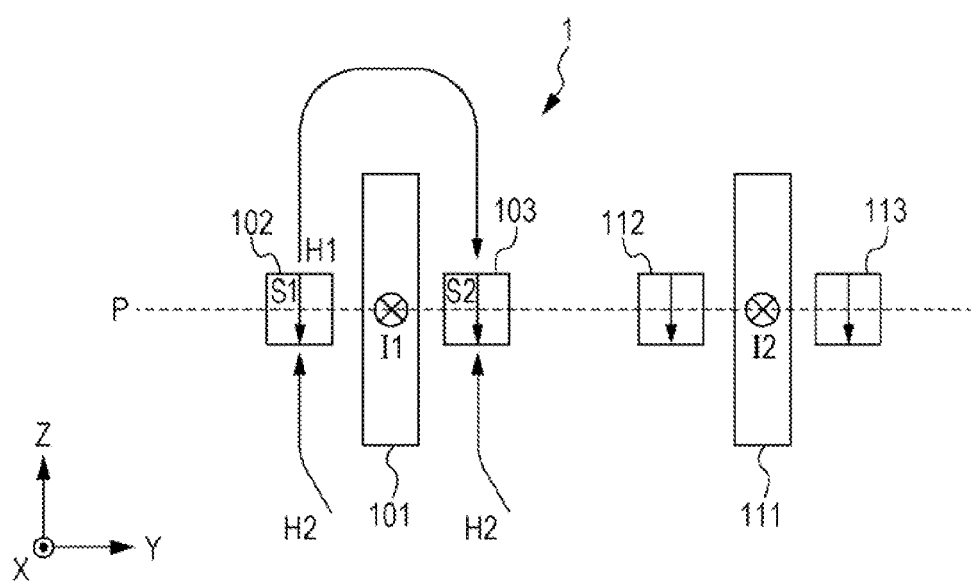

In this embodiment, a first aspect of a current sensor will be described. FIGS. 1A and 1B are schematic diagrams showing a configuration example of a current sensor 1 according to the embodiment. FIG. 1A is a perspective view schematically showing a configuration of the current sensor 1, and FIG. 1B is a schematic diagram showing a positional relationship between conductors 101 and 111 and magnetoelectric transducers 102, 103, 112, and 113 in the current sensor 1.

As shown in FIG. 1A, the current sensor 1 includes the conductor (first conductor) 101 and the conductor (second conductor) 111 that form current paths. The conductors 101 and 111 extend in a first direction (X axis direction) and have flat plate shapes parallel to each other. The conductors 101 and 111 have predetermined thicknesses in a second direction (Y axis direction) orthogonal to the first direction and have predetermined widths in a third direction (Z axis direction) orthogonal to the first direction and the second direction.

A circuit board 105 having a substantially U planar shape is arranged adjacently to the conductor 101. The circuit board 105 has a recess-like cut 106 and a pair of arm portions 107 and 108 extending at both sides of the cut 106 in the third direction. The conductor 101 is located within the cut 106 of the circuit board 105. In addition, the circuit board 105 is arranged such that a surface A1 thereof which is a principal surface is orthogonal to the first direction in which the conductor 101 extends (i.e., the direction of the current path).

The magnetoelectric transducer (first magnetoelectric transducer) 102 and the magnetoelectric transducer (second magnetoelectric transducer) 103 are arranged at the surface A1 sides of a pair of the arm portions 107 and 108 such that the conductor 101 is interposed therebetween. Specifically, the magnetoelectric transducer 102 is arranged at one side of a principal surface (a surface parallel to an XZ plane) B1 of the conductor 101, and the magnetoelectric transducer 103 is arranged at another side of the principal surface B1.

As shown in FIG. 1B, the magnetoelectric transducers 102 and 103 are arranged such that sensitivity axes S1 and S2 thereof are directed in the same direction within a plane parallel to the surface A1 of the circuit board 105. In addition, the magnetoelectric transducers 102 and 103 are arranged such that the sensitivity axes S1 and S2 thereof are directed in the third direction substantially parallel to the principal surface B1 of the conductor 101. Thus, when a measured current I1 flows through the conductor 101, an induction field H1 is applied to the magnetoelectric transducers 102 and 103 in directions opposite to the sensitivity axes thereof.

The magnetoelectric transducers 102 and 103 are arranged on a straight line connecting center positions that divide the widths of the conductors 101 and 111 (the lengths in the third direction) in half. In other words, as shown in FIG. 1B, the magnetoelectric transducers 102 and 103 are arranged along a virtual plane (plane) P including the center positions in the width direction of the conductors 101 and 111. The virtual plane P is a plane parallel to an XY plane and is orthogonal to the surface A1 of the circuit board 105. Thus, the sensitivity axis directions of the magnetoelectric transducers 102 and 103 may be orthogonal to the virtual plane P.

Figure 2:
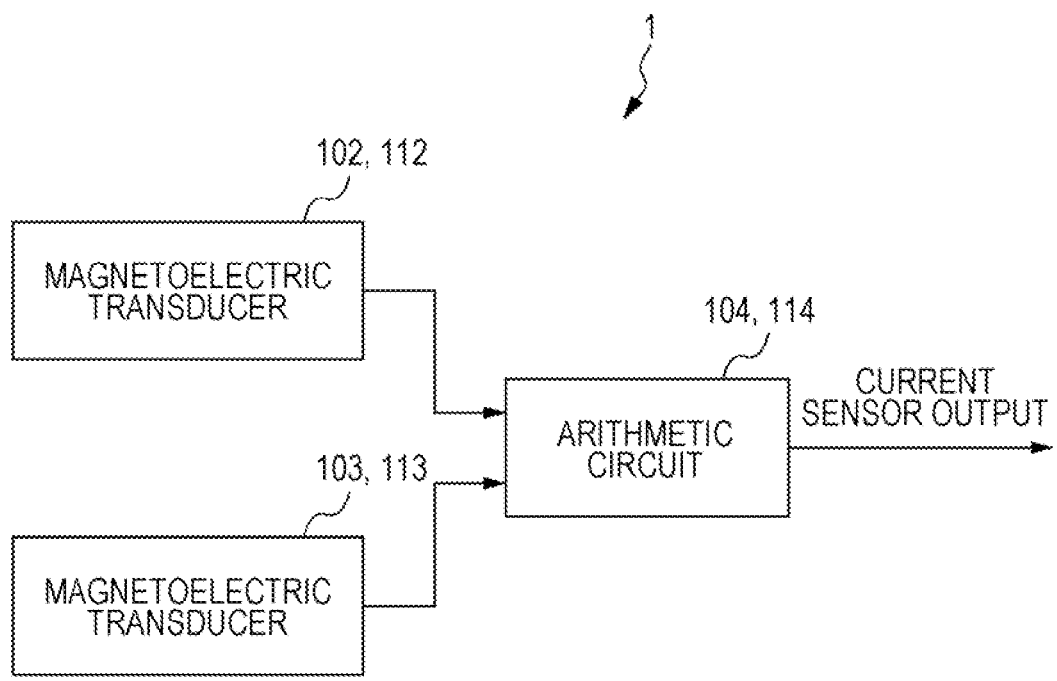
FIG. 2 is a block diagram showing a circuit configuration of the current sensor according to Embodiment 1.

FIG. 2 is a block diagram showing a circuit configuration of the current sensor 1. As shown in FIG. 2, an arithmetic circuit 104 is connected to a stage subsequent to the magnetoelectric transducers 102 and 103. The arithmetic circuit 104 is mounted on the circuit board 105, and performs a differential operation on the outputs of the magnetoelectric transducers 102 and 103 and outputs a result of the operation. Influence of the outputs having the same polarity (output change) from the magnetoelectric transducers 102 and 103 are weakened by the differential operation of the arithmetic circuit 104. In other words, influence of a magnetic field (e.g., earth magnetism) applied in the same direction as that of the sensitivity axis of each of the magnetoelectric transducers 102 and 103 is weakened by the differential operation, and current measurement accuracy is kept high.

It should be noted that the magnetoelectric transducers 112 and 113, a circuit board 115, and an arithmetic circuit 114 which have the same configurations are arranged also at the conductor 111 side. In other words, the circuit board 115 is arranged adjacently to the conductor 111 and has a recess-like cut 116, and the magnetoelectric transducers 112 and 113 are arranged at surface A2 sides of a pair of arm portions 117 and 118 of the circuit board 115 such that the conductor 111 is interposed therebetween. The magnetoelectric transducer 112 is arranged at one side of a principal surface B2 of the conductor 111, and the magnetoelectric transducer 113 is arranged at another side of the principal surface B2. In addition, the arithmetic circuit 114 is connected to a stage subsequent to the magnetoelectric transducers 112 and 113. However, the current sensor 1 may not include the components at the conductor 111 side.

When a current I2 as shown in FIG. 1B flows through the conductor 111 of the current sensor 1 configured thus, an induction fields H2 is generated by the current I2 at the positions where the magnetoelectric transducers 102 and 103 are arranged. The direction of the induction field H2 is substantially the same at the positions where the magnetoelectric transducers 102 and 103 are arranged. Thus, influence of the induction field H2 is cancelled by the differential operation of the arithmetic circuit 104.

As described above, in the current sensor 1 according to the embodiment, since the conductor 111 and the magnetoelectric transducers 102 and 103 (the conductor 101 may be included) are arranged along the same virtual plane P, it is possible to eliminate, from the sensor output, influence of the induction fields H2 generated by the current I2 flowing through the conductor 111. In this case, the necessity to arrange the magnetoelectric transducers such that the magnetoelectric transducers are tilted relative to the conductors 101 and 111 is eliminated, and thus it is possible to achieve high current measurement accuracy with a simple configuration.

In addition, the conductors 101 and 111 may have flat plate shapes in which width directions thereof are orthogonal to the virtual plane P, and may be arranged such that center positions thereof in the width directions are arranged along the virtual plane P. Thus, the direction of an induction field H2 generated by a current I2 flowing through the conductor 111 is unlikely to be changed near the center position of the conductor 101. Thus, even when the positions where the magnetoelectric transducers 102 and 103 are arranged are displaced slightly, the directions in which the induction field H2 is applied to the magnetoelectric transducers 102 and 103 are made substantially equal to each other, and hence it is possible to appropriately eliminate influence of the induction field H2.

As described above, the positions where the conductor 111 and the magnetoelectric transducers 102 and 103 (the conductor 101 may be included) are arranged in the current sensor 1 may not be strictly located along the virtual plane P. For example, even when the direction of an induction field generated by a current flowing through the conductor 111 is slightly different between the positions where the magnetoelectric transducers 102 and 103 are arranged, if the difference in the direction is very small (e.g., within 10°), it is possible to reduce influence of the induction field generated by the current flowing through the conductor 111, to such a degree as to cause no practical problem. Thus, being arranged along the same virtual plane P also includes a case where the direction of an induction field generated by a current flowing through the conductor 111 is different within 10°.

(Embodiment 2)

Figure 4A:
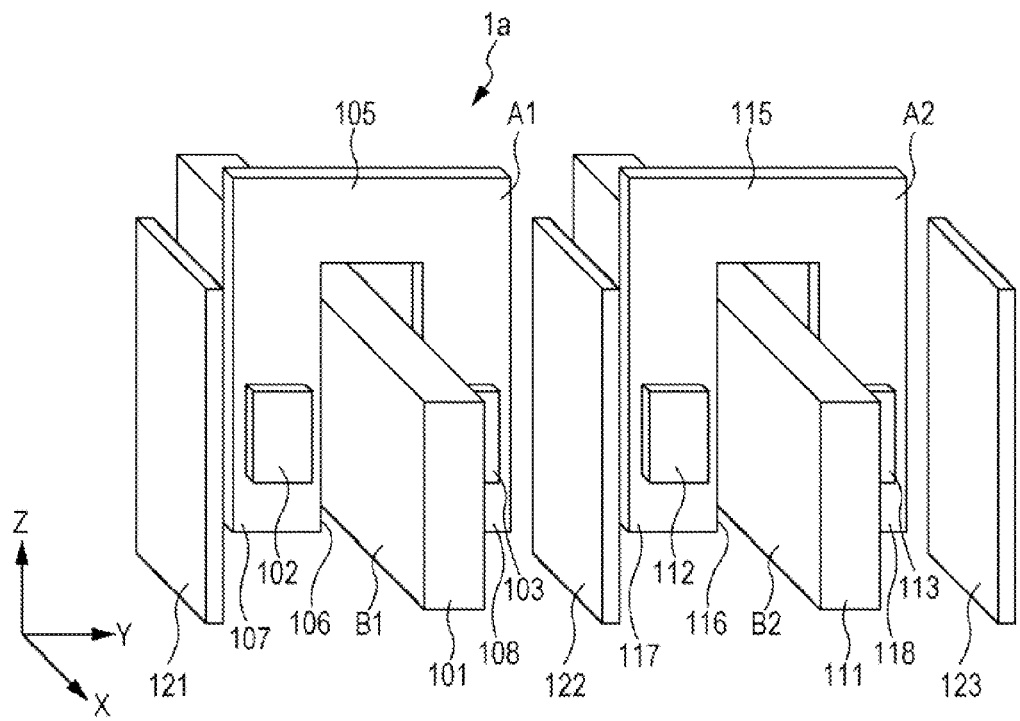
FIGS. 4A and 4B are schematic diagrams showing a configuration example of a current sensor according to Embodiment 2.
Figure 4B:
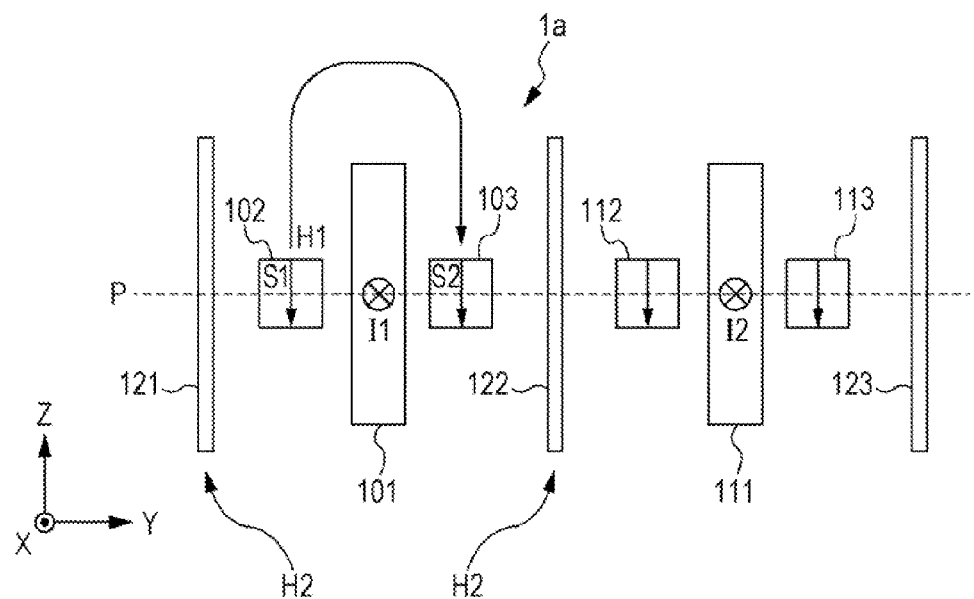

In this embodiment, a second aspect of the current sensor will be described. FIGS. 4A and 4B are schematic diagrams showing a configuration example of a current sensor 1a according to the embodiment. FIG. 4A is a perspective view schematically showing a configuration of the current sensor 1a, and FIG. 4B is a schematic diagram showing a positional relationship between conductors 101 and 111, magnetoelectric transducers 102, 103, 112, and 113, and magnetic shields (magnetic yokes) 121, 122, and 123 in the current sensor 1a. It should be noted that many of the components of the current sensor 1a according to the embodiment are the same as the components of the current sensor 1 according to Embodiment 1. Thus, the components that are the same as those of the current sensor 1 are designated by the same reference signs, and the detailed description thereof is omitted.

As shown in FIG. 4A, in the current sensor 1a according to the embodiment, the thin plate-shaped magnetic shields (magnetic yokes) 121 and 122 made of a high-permeability material are provided at a position at the external side of the magnetoelectric transducer 102 (the side opposite to the conductor 101) and at a position at the external side of the magnetoelectric transducer 103 (the side opposite to the conductor 101), respectively. In other words, the magnetic shields 121 and 122 may be arranged such that the magnetoelectric transducers 102 and 103 and the conductor 101 are interposed therebetween. In addition, as shown in FIG. 4B, the magnetic shields 121 and 122 are arranged so as to intersect a virtual plane P.

When such magnetic shields 121 and 122 made of a high-permeability material are arranged, a magnetic flux around the magnetic shields 121 and 122 is concentrated on the magnetic shields 121 and 122. Thus, as shown in FIG. 4B, influence of an induction field H2 generated by a current I2 flowing through the conductor 111 is balanced by the magnetoelectric transducer 102 and the magnetoelectric transducer 103 and is allowed to be more appropriately cancelled by a differential operation.

It should be noted that the magnetic shield 123 having the same configuration is arranged also at the conductor 111 side. In other words, the magnetic shield 123 is provided also at a position at the external side of the magnetoelectric transducer 113 (the side opposite to the conductor 111), and the magnetoelectric transducers 112 and 113 and the conductor 111 are interposed between the magnetic shields 122 and 123. In addition, the magnetic shield 123 is arranged so as to intersect the virtual plane P. However, the current sensor 1a may not include the components at the conductor 111 side.

As described above, in the current sensor 1a according to the embodiment, a pair of the magnetic shields 121 and 122 allow further reduction of influence of the induction field H2 generated by the current I2 flowing through the conductor 111, and thus it is possible to achieve higher current measurement accuracy. It is possible to implement the configuration shown in the embodiment, in combination with a configuration shown in another embodiment as appropriate.

(Embodiment 3)

Figure 5A:
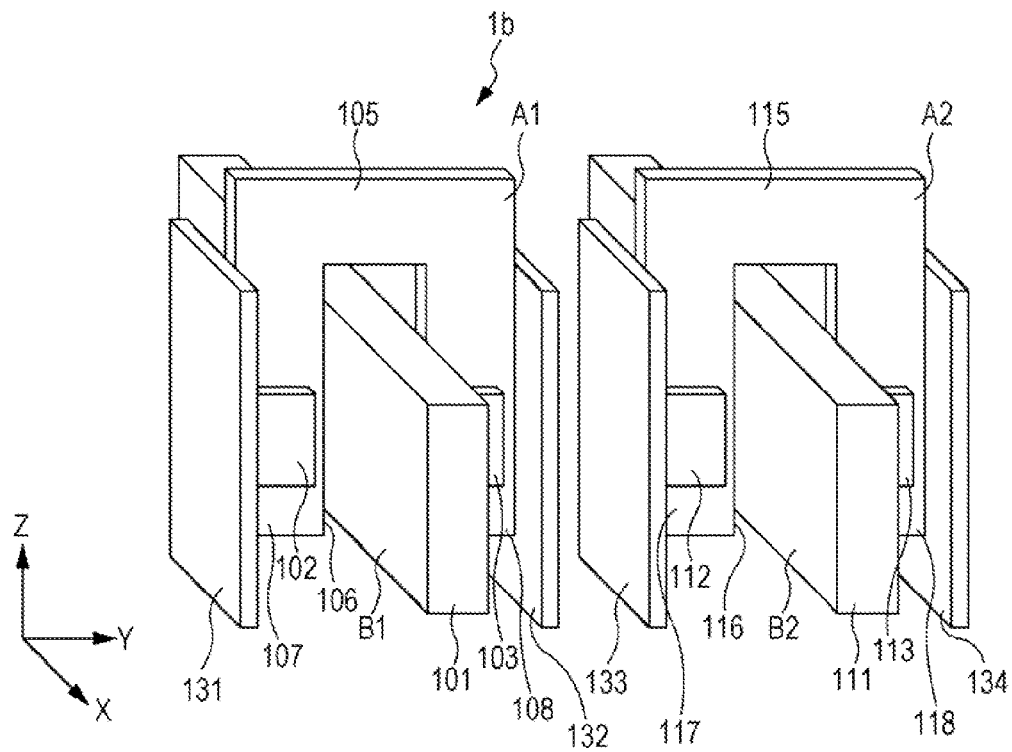
FIGS. 5A and 5B are schematic diagrams showing a configuration example of a current sensor according to Embodiment 3.
Figure 5B:
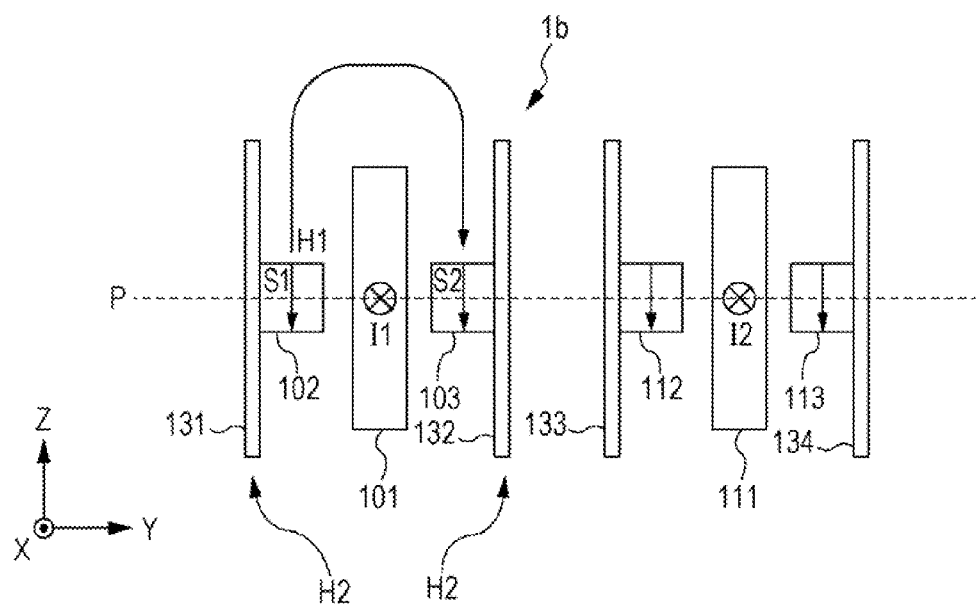

In this embodiment, a third aspect of the current sensor will be described. FIGS. 5A and 5B are schematic diagrams showing a configuration example of a current sensor 1b according to the embodiment. FIG. 5A is a perspective view schematically showing a configuration of the current sensor 1b, and FIG. 5B is a schematic diagram showing a positional relationship between conductors 101 and 111, magnetoelectric transducers 102, 103, 112, and 113, and magnetic shields 131, 132, 133, and 134 in the current sensor 1b. It should be noted that many of the components of the current sensor 1b according to the embodiment are the same as the components of the current sensor 1 according to Embodiment 1. Thus, the components that are the same as those of the current sensor 1 are designated by the same reference signs, and the detailed description thereof is omitted.

As shown in FIG. 5A, the current sensor 1b according to the embodiment also includes the thin plate-shaped magnetic shields (magnetic yokes) 131 and 132 made of a high-permeability material at a position at the external side of the magnetoelectric transducer 102 (the side opposite to the conductor 101) and at a position at the external side of the magnetoelectric transducer 103 (the side opposite to the conductor 101), respectively. In other words, the magnetic shields 131 and 132 are arranged such that the magnetoelectric transducers 102 and 103 and the conductor 101 are interposed therebetween. In addition, as shown in FIG. 5B, the magnetic shields 131 and 132 are arranged so as to intersect a virtual plane P.

When such magnetic shields 131 and 132 made of a high-permeability material are arranged, a magnetic flux around the magnetic shields 131 and 132 is concentrated on the magnetic shields 131 and 132. Thus, as shown in FIG. 5B, influence of an induction field H2 generated by a current I2 flowing through the conductor 111 is balanced by the magnetoelectric transducer 102 and the magnetoelectric transducer 103, and is allowed to be more appropriately cancelled by a differential operation.

It should be noted that the magnetic shields 133 and 134 having the same configuration are arranged also at the conductor 111 side. In other words, the magnetic shield 133 is provided at a position at the external side of the magnetoelectric transducer 112 (the side opposite to the conductor 111), and the magnetic shield 134 is provided at a position at the external side of the magnetoelectric transducer 113 (the side opposite to the conductor 111). The magnetoelectric transducers 112 and 113 and the conductor 111 are interposed between the magnetic shields 133 and 134. In addition, the magnetic shields 133 and 134 are arranged so as to intersect the virtual plane P. However, the current sensor 1b may not include the components at the conductor 111 side.

As described above, in the current sensor 1b according to the embodiment, it is possible to further reduce influence of the induction field H2 generated by the current I2 flowing through the conductor 111, by a pair of the magnetic shields 131 and 132, and thus it is possible to achieve higher current measurement accuracy. In addition, in the current sensor 1b according to the embodiment, since the magnetic shields 131, 132, 133, and 134 are arranged so as to correspond to the respective magnetoelectric transducers 102, 103, 112, and 113, it is possible to cause the magnetic shields 131, 132, 133, and 134 to be sufficiently adjacent to the magnetoelectric transducers 102, 103, 112, and 113. Thus, it is possible to achieve further high current measurement accuracy as compared to the current sensor 1a according to Embodiment 2. It is possible to implement the configuration shown in the embodiment, in combination with a configuration shown in another embodiment as appropriate.

(Embodiment 4)

Figure 6:
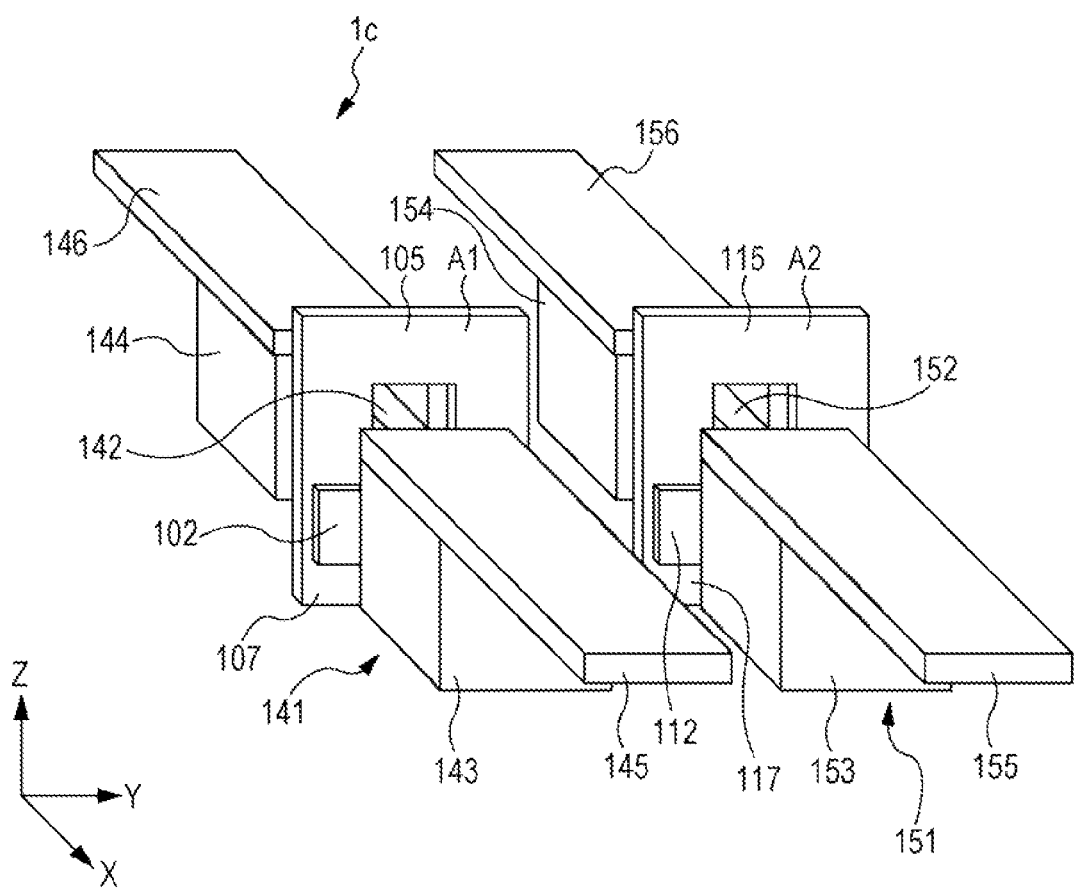
FIG. 6 is a schematic diagram showing a configuration example of a current sensor according to Embodiment 4.

In the embodiment, a fourth aspect of the current sensor will be described. FIG. 6 is a schematic diagram showing a configuration example of a current sensor 1c according to the embodiment. It should be noted that many of the components of the current sensor 1c according to the embodiment are the same as the components of the current sensor 1 according to Embodiment 1. Thus, the components that are the same as those of the current sensor 1 are designated by the same reference signs, and the detailed description thereof is omitted.

As shown in FIG. 6, the current sensor 1c according to the embodiment includes a conductor (first conductor) 141 and a conductor (second conductor) 151 which have shapes different from those in the current sensor 1 according to Embodiment 1. The conductors 141 and 151 extend in a first direction (X axis direction), and each may include a thin plate portion 142 or 152 and thick plate portions 143 and 144 or 153 and 154 at both sides thereof.

The thicknesses of the thin plate portions 142 and 152 in a second direction are smaller than the thicknesses of the thick plate portions 143, 144, 153, and 154 in the second direction. Meanwhile, the widths of the thin plate portions 142 and 152 in a third direction are substantially equal to the widths of the thick plate portions 143, 144, 153, and 154 in the third direction. The thin plate portions 142 and 152 may be located within the cut 106 of the circuit board 105, and the thin plate portion 142 of the conductor 141 may be interposed between the magnetoelectric transducers 102 and 103 (the magnetoelectric transducer 103 is not shown in FIG. 6).

Conductors 145, 146, 155, and 156 are connected to the thick plate portions 143, 144, 153, and 154, respectively, and extend in the first direction (X axis direction). The conductors 145, 146, 155, and 156 have flat plate shapes parallel to the XY plane. It should be noted that the current sensor 1c may not include the conductors 145, 146, 155, and 156.

As described above, the current sensor 1c according to the embodiment includes the conductor 141 which includes the thin plate portion 142 at which the magnetoelectric transducers 102 and 103 are arranged, and the thick plate portions 143 and 144 at both side of the thin plate portion 142. Thus, when the circuit board 105 (and a housing in which the circuit board 105 is accommodated) is arranged so as to be interposed between the thick plate portions 143 and 144, it is possible to more appropriately position the magnetoelectric transducers 102 and 103 relative to the conductor 141. In addition, the electrical resistance of the conductor 141 is reduced by the thick plate portions 143 and 144, and thus it is possible to suppress heat generation caused by flowing of a measured current I1. As a result of them, it is possible to achieve higher current measurement accuracy. In addition, when the thick plate portions 143 and 144 are used as terminal blocks, it is possible to easily mount the extended conductors 145 and 146. It is possible to implement the configuration shown in the embodiment, in combination with a configuration shown in another embodiment as appropriate.

EXAMPLES

Examples made in order to check effectiveness of the current sensors described in the above-described embodiments will be described. However, the configuration of the present invention is not limited to the descriptions of the examples.

For current sensors having the same configurations as those of the current sensor 1 according to Embodiment 1 (see FIG. 1) and the current sensor 1b according to Embodiment 3 (see FIG. 5), influence of a measurement error caused by an adjacent current was calculated (Examples 1 and 2). In addition, for the purpose of comparison, for the current sensor 2 shown in FIG. 3, influence of a measurement error caused by an adjacent current was calculated (a comparative example). In Examples 1 and 2 and the comparative example, a conductor whose cross-sectional shape (a cross-sectional shape parallel to the YZ plane) is a rectangular cross-sectional shape (10 mm×2 mm) was used as a conductor through which a measured current flows (corresponding to the conductors 101 and 202) and a conductor through which an adjacent current flows (corresponding to the conductors 111 and 211). In addition, the distance between the center of the conductor through which the measured current flows and the center of the conductor through which the adjacent current flows was set at 15 mm.

Figure 7:
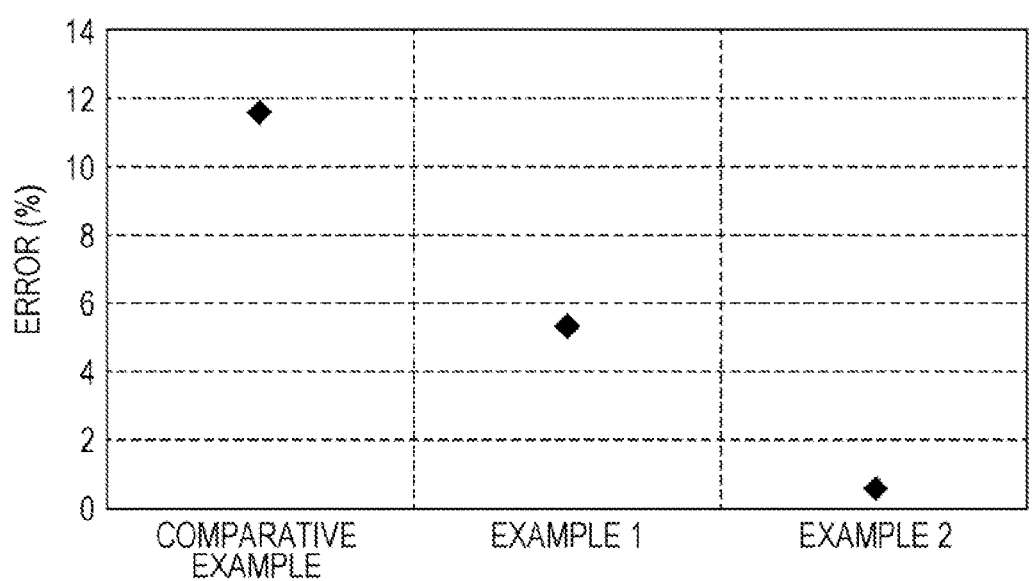
FIG. 7 is a diagram showing influence of an adjacent current in each configuration.

FIG. 7 is a diagram showing influence of an adjacent current in each configuration. In FIG. 7, the vertical axis indicates a measurement error caused by an adjacent current in percent of the current value of the adjacent current. From FIG. 7, for example, it appears that when the adjacent current was 100 A, an error of about 12 A occurred in the comparative example. On the other hand, an error in Example 1 was about 5 A, and an error in Example 2 was equal to or less than 1 A. In other words, the influence of the adjacent current in Example 1 was reduced to be equal to or less than ½ of that in the comparative example. In addition, in Example 2, the influence of the adjacent current was reduced to be very small. As described above, the current sensors described in the above-described embodiments are able to suppress influence of an adjacent current.

It should be noted that the present invention is not limited to the above-described embodiments and various changes can be made to implement the present invention. For example, in the above-described embodiments, the magnetoelectric transducers are arranged on the substantially U-shaped circuit board. However, the shape and the like of the circuit board are not particularly limited as long as it is possible to appropriately arrange the magnetoelectric transducers with respect to the conductor through which a current flows. In addition, in the above-described embodiments, the case has been described in which another conductor is arranged adjacently to the conductor through which a measured current flows. However, a plurality of conductors may be arranged adjacently to the conductor through which a measured current flows. Moreover, it is possible to change the connection relationship, the position, the size, and the range of each component in the above-described embodiments to implement the present invention. In addition, it is possible to make appropriate changes to implement the present invention.

The current sensor according to the present invention is useful, for example, when a current flowing through an inverter for motor driving is measured.

What is claimed is:

1. A current sensor comprising:
    a first conductor and a second conductor arranged so as to form current paths parallel to each other;
    a circuit board arranged such that a surface thereof is perpendicular to the current paths; and
    a first magnetoelectric transducer and a second magnetoelectric transducer arranged on the surface of the circuit board such that the first conductor is interposed therebetween,
    wherein the first conductor, the second conductor, the first magnetoelectric transducer, and the second magnetoelectric transducer are located on a same plane orthogonal to the surface of the circuit board,
    and wherein each of the first conductor and the second conductor has a flat plate shape in which a width direction thereof is orthogonal to the plane, and a center position thereof in the width direction is located on the plane.

2. A current sensor comprising:
a first conductor and a second conductor arranged so as to form current paths parallel to each other;
a circuit board arranged such that a surface thereof is perpendicular to the current paths;
a first magnetoelectric transducer and a second magnetoelectric transducer arranged on the surface of the circuit board such that the first conductor is interposed therebetween; and
a pair of magnetic shields arranged such that the first conductor, the first magnetoelectric transducer, and the second magnetoelectric transducer are interposed therebetween,
wherein the first conductor, the second conductor, the first magnetoelectric transducer, and the second magnetoelectric transducer are located on a same plane orthogonal to the surface of the circuit board, and the magnetic shields intersect the plane.

3. The current sensor according to claim 1, wherein each of the first magnetoelectric transducer and the second magnetoelectric transducer is arranged such that a sensitivity axis direction thereof is orthogonal to the plane.

4. A current sensor comprising:
a first conductor and a second conductor arranged so as to form current paths parallel to each other;
a circuit board arranged such that a surface thereof is perpendicular to the current paths; and
a first magnetoelectric transducer and a second magnetoelectric transducer arranged on the surface of the circuit board such that the first conductor is interposed therebetween,
wherein the first conductor, the second conductor, the first magnetoelectric transducer, and the second magnetoelectric transducer are located on a same plane orthogonal to the surface of the circuit board,
and wherein each of the first conductor and the second conductor includes a thin plate portion and thick plate portions at both sides of the thin plate portion, and the first magnetoelectric transducer and the second magnetoelectric transducer are arranged such that the thin plate portion of the first conductor is interposed therebetween.

* * * * *